(12) United States Patent
Jain et al.

(10) Patent No.: US 11,804,543 B2
(45) Date of Patent: Oct. 31, 2023

(54) DIODE STRUCTURES WITH ONE OR MORE RAISED TERMINALS

(71) Applicant: GlobalFoundries U.S. Inc., Malta, NY (US)

(72) Inventors: Vibhor Jain, Essex Junction, VT (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 17/540,339

(22) Filed: Dec. 2, 2021

(65) Prior Publication Data

US 2023/0067948 A1 Mar. 2, 2023

Related U.S. Application Data

(60) Provisional application No. 63/237,206, filed on Aug. 26, 2021.

(51) Int. Cl.
*H01L 29/739* (2006.01)
*H01L 29/66* (2006.01)

(52) U.S. Cl.
CPC .... *H01L 29/7391* (2013.01); *H01L 29/66356* (2013.01)

(58) Field of Classification Search
CPC ........... H01L 29/7391; H01L 29/66356; H01L 29/0623; H01L 29/0619; H01L 29/872
See application file for complete search history.

(56) References Cited

U.S. PATENT DOCUMENTS

| | | | |
|---|---|---|---|
| 8,299,558 B2 | 10/2012 | Botula et al. | |
| 8,642,453 B2 | 2/2014 | Nowak | |
| 10,535,551 B2 | 1/2020 | Feilchenfeld et al. | |
| 2007/0267700 A1* | 11/2007 | Russ | H01L 29/868 257/E29.195 |
| 2010/0230751 A1* | 9/2010 | Botula | H01L 29/7839 257/E21.409 |
| 2011/0254080 A1 | 10/2011 | Doris et al. | |
| 2012/0235239 A1 | 9/2012 | Cheng et al. | |
| 2018/0287378 A1* | 10/2018 | Sithanandam | H01L 27/1203 |
| 2018/0358352 A1* | 12/2018 | Voldman | H01L 27/0255 |
| 2020/0020813 A1* | 1/2020 | Lo | H01L 29/402 |

FOREIGN PATENT DOCUMENTS

JP 2006319096 A 11/2006

* cited by examiner

*Primary Examiner* — Wasiul Haider
(74) *Attorney, Agent, or Firm* — Thompson Hine LLP; Francois Pagette

(57) ABSTRACT

Structures for a diode and methods of fabricating a structure for a diode. The structure includes a layer comprised of a semiconductor material. The layer includes a first section, a second section, and a third section laterally positioned between the first section and the second section. The structure includes a first terminal having a raised semiconductor layer on the first section of the layer, a second terminal including a portion on the second section of the layer, and a gate on the third section of the layer.

20 Claims, 7 Drawing Sheets

DIODE STRUCTURES WITH ONE OR MORE RAISED TERMINALS

CROSS-REFERENCE TO RELATED APPLICATIONS

This application claims the benefit of U.S. Provisional Application No. 63/237,206, filed Aug. 26, 2021, which is hereby incorporated by reference herein in its entirety.

BACKGROUND

The disclosure relates generally to semiconductor devices and integrated circuit fabrication and, in particular, to structures for a diode and methods of forming a structure for a diode.

High-performance diodes are implemented in radiofrequency technologies to support applications like millimeter-wave frequency-doublers and sub-harmonic mixers, power detectors, low-noise voltage-controlled oscillators, and high-speed data-converter front-ends. A Schottky barrier diode is a semiconductor diode formed by the junction of a metal with a lightly-doped semiconductor. A PIN diode includes an intrinsic semiconductor region between a p-type semiconductor region and an n-type semiconductor region.

Improved structures for a diode and methods of forming a structure for a diode are needed.

SUMMARY

In an embodiment, a structure for a diode is provided. The structure includes a layer comprised of a semiconductor material. The layer includes a first section, a second section, and a third section laterally positioned between the first section and the second section. The structure further includes a first terminal having a raised semiconductor layer on the first section of the layer, a second terminal including a portion on the second section of the layer, and a gate on the third section of the layer.

In an embodiment, a method of fabricating a structure for a diode is provided. The method includes forming a first terminal including a raised semiconductor layer on a first section of a layer comprised of a semiconductor material, forming a second terminal including a portion on a second section of the layer, and forming a gate on a third section of the layer. The third section of the layer is laterally positioned between the first section of the layer and the second section of the layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 9 is a diagrammatic top view, simplified for purposes of illustration, in which FIG. 8 is taken generally along line 8-8.

DETAILED DESCRIPTION

Figure 1:
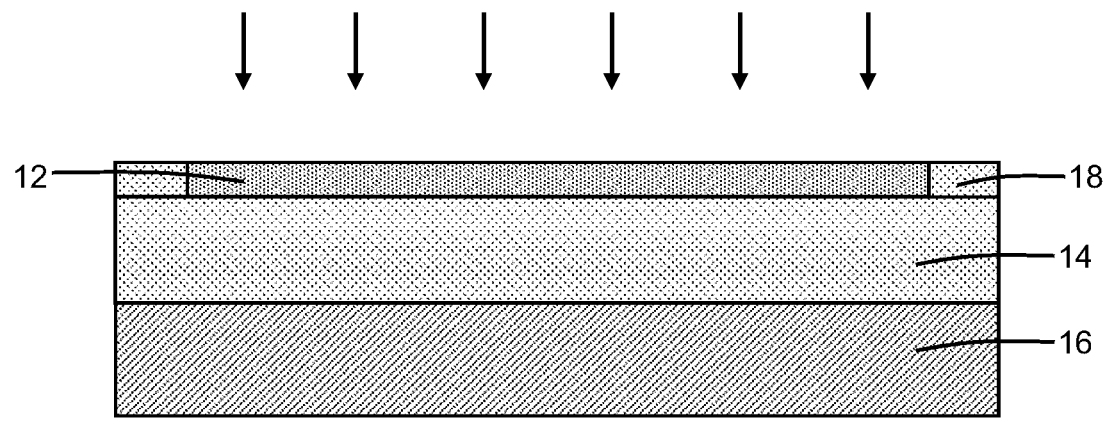
FIGS. 1-8 are cross-sectional views of a structure at successive fabrication stages of a processing method in accordance with embodiments of the invention.

With reference to FIG. 1 and in accordance with embodiments of the invention, a semiconductor-on-insulator substrate includes a device layer 12 defining a layer that contains a semiconductor material, a buried insulator layer 14 beneath the device layer 12, and a handle substrate 16 beneath the buried insulator layer 14. The buried insulator layer 14 has a lower interface with the handle substrate 16 and an upper interface with the device layer 12, and the lower and upper interfaces are separated by the thickness of the buried insulator layer 14. In an embodiment, the device layer 12 may have a thickness in a range of about 4 nanometers (nm) to about 100 nm. In an alternative embodiment, the device layer 12 may have a thickness in a range of about 4 nm to about 10 nm. In an embodiment, the device layer 12 may be used to fabricate fully-depleted silicon-on-insulator device structures.

The handle substrate 16 may be comprised of a semiconductor material, such as single-crystal silicon. The buried insulator layer 14 may be comprised of a dielectric material, such as silicon dioxide, that is an electrical insulator. The device layer 12 may be separated, and electrically isolated, from the handle substrate 16 by the buried insulator layer 14.

A shallow trench isolation region 18 penetrates fully through the device layer 12. The shallow trench isolation region 18 may be formed by etching trenches using a patterned hardmask, depositing a dielectric material, such as silicon dioxide, in the trenches, and planarizing with chemical-mechanical polishing. The shallow trench isolation region 18 surrounds an active region of the device layer 12 in which a structure for a diode may be subsequently formed.

In an embodiment, the device layer 12 may be comprised of a layer of a single-crystal semiconductor material, such as single-crystal silicon. In an alternative embodiment, the device layer 12 in the active region may be modified to add germanium through, for example, a condensation process, such that the device layer 12 in the active region is fully comprised of silicon-germanium. In an alternative embodiment, the device layer 12 in the active region may be modified to contain a combination of both silicon and silicon-germanium. For example, germanium may be introduced into only a portion of the device layer 12 in the active region.

In an embodiment, the semiconductor material of the device layer 12 in the active region may intrinsic. In an alternative embodiment, the semiconductor material of the device layer 12 in the active region may be lightly-doped to provide, for example, p-type electrical conductivity. The doping may be provided by an ion implantation process, as diagrammatically shown by the single-headed arrows in FIG. 1, and the dopant concentration may be in a range of about $1 \times 10^{15}$ cm$^{-3}$ to about $1 \times 10^{17}$ cm$^{-3}$. The additional doping may be used for performance tuning of the subsequently-formed diode.

Figure 2:
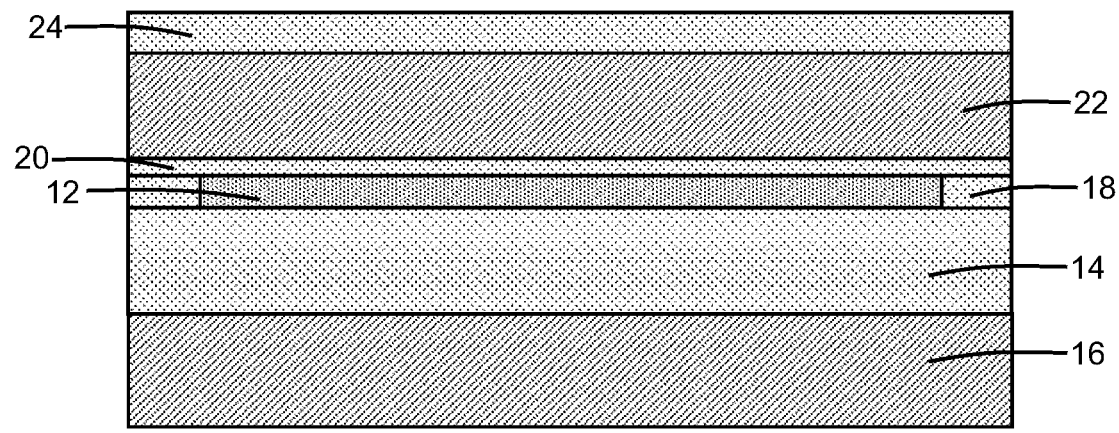

With reference to FIG. 2 in which like reference numerals refer to like features in FIG. 1 and at a subsequent fabrication stage, a dielectric layer 20, a gate layer 22, and a dielectric layer 24 are formed in a layer stack over the device layer 12 and shallow trench isolation region 18. The dielectric layer 20 may be comprised of a dielectric material, such as silicon dioxide. The gate layer 22 may be comprised of a doped polycrystalline semiconductor material, such as doped polysilicon. The dielectric layer 24 may be comprised of a dielectric material, such as silicon nitride.

Figure 3:
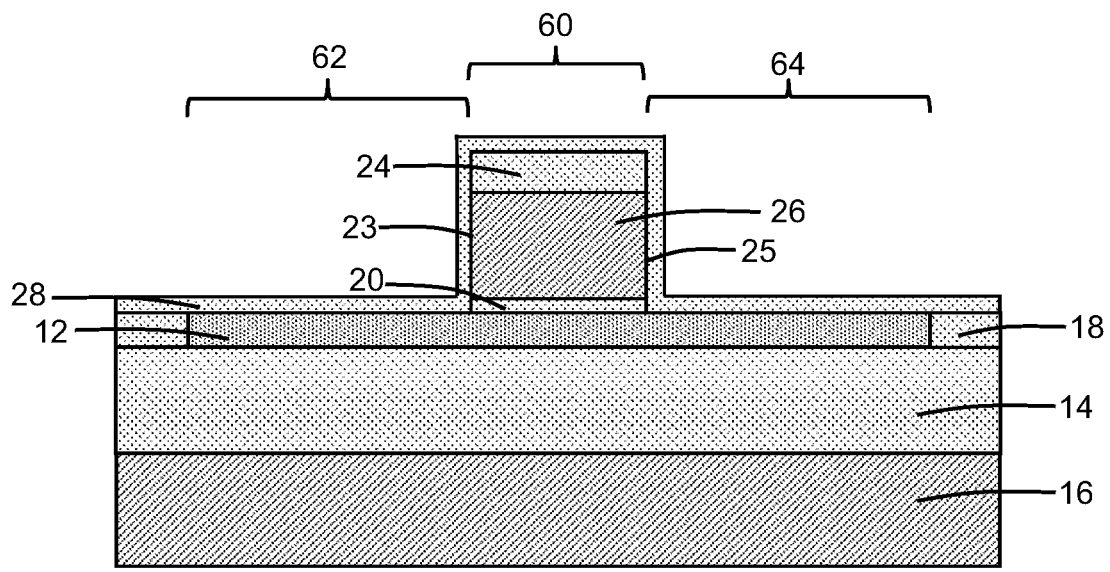

With reference to FIG. 3 in which like reference numerals refer to like features in FIG. 2 and at a subsequent fabrication stage, the layers 20, 22, 24 of the layer stack may be patterned by lithography and etching processes. The gate 26 includes a patterned section of the gate layer 22 that is located over a patterned section of the dielectric layer 20. The gate 26 and patterned section of the dielectric layer 20 are positioned over a section 60 of the device layer 12. The patterned section of the dielectric layer 20 is positioned in a vertical direction between the gate 26 and the section 60 of the device layer 12, and a patterned section of the layer 24 defines a dielectric cap positioned over the gate 26. A dielectric layer 28 comprised of a dielectric material, such as silicon nitride, may be conformally deposited after the gate 26 is patterned.

The section 60 of the device layer 12 is laterally arranged between adjacent sections 62, 64 of the device layer 12 that are opened by the patterning of the layers 20, 22, 24. The section 62 of the device layer 12 is positioned adjacent to a sidewall 23 of the gate 26. The section 64 of the device layer 12 is positioned adjacent to an opposite sidewall 25 of the gate 26.

Figure 4:
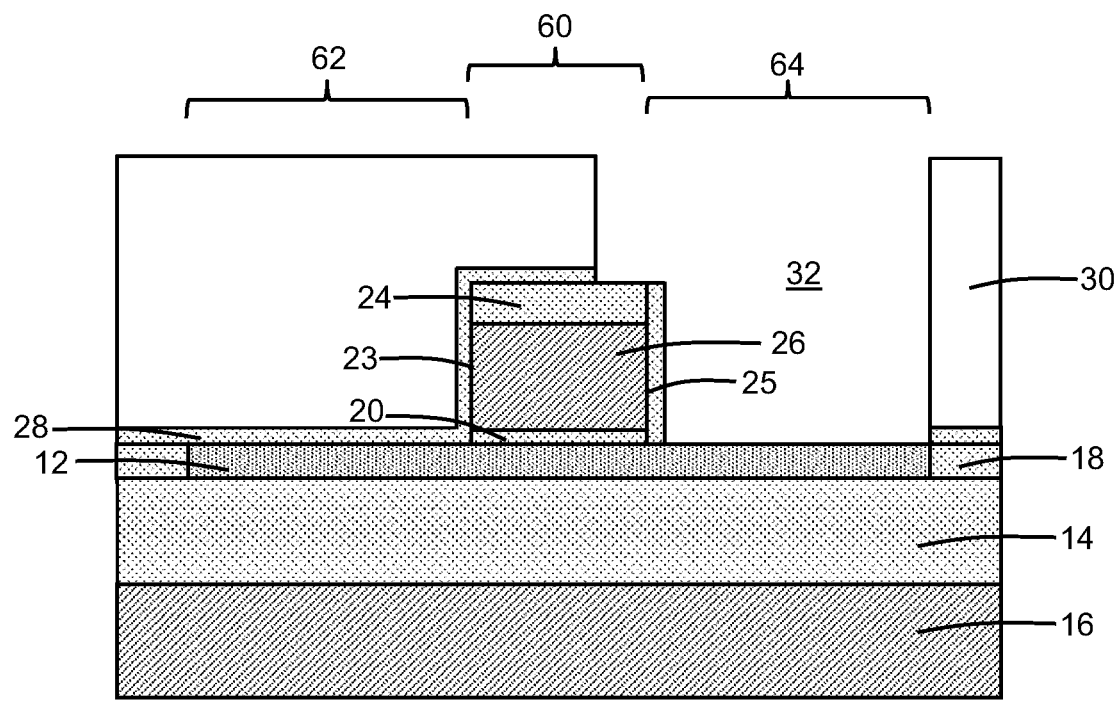

With reference to FIG. 4 in which like reference numerals refer to like features in FIG. 3 and at a subsequent fabrication stage, an etch mask 30 is formed and an opening 32 is formed in the etch mask 30 that exposes a portion of the dielectric layer 28 over the section 64 of the device layer 12. The etch mask 30 may include a layer of a photoresist applied by a spin-coating process, pre-baked, exposed to light projected through a photomask, baked after exposure, and developed with a chemical developer to define the opening 32. The exposed portion of the dielectric layer 28 is removed by an etching process. The etch mask 30 may be stripped by, for example, ashing.

Figure 5:
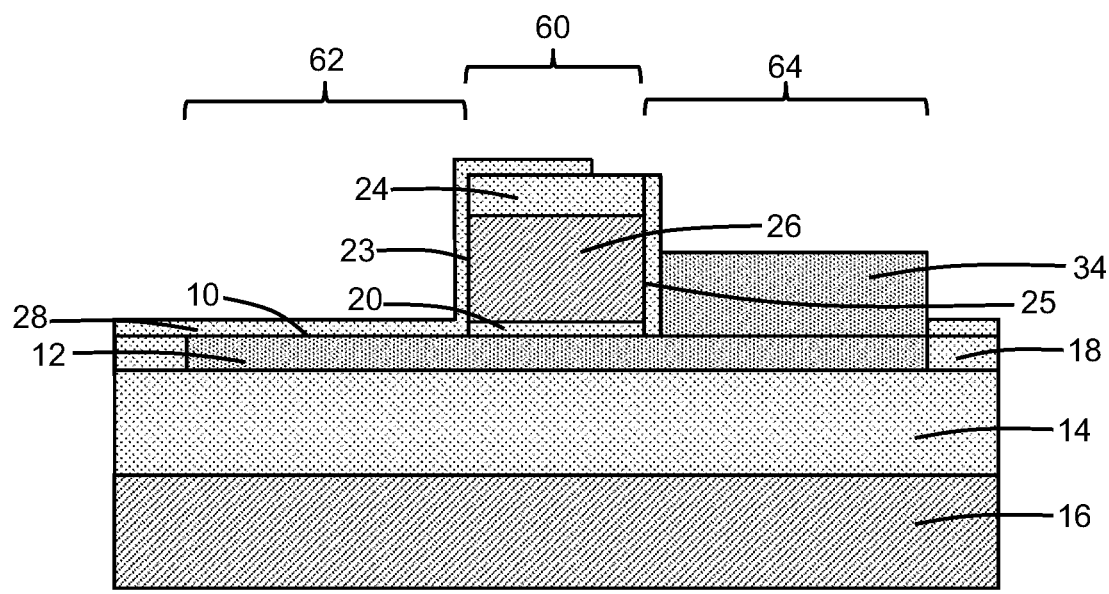

With reference to FIG. 5 in which like reference numerals refer to like features in FIG. 4 and at a subsequent fabrication stage, a semiconductor layer 34 is formed on the section 64 of the device layer 12 and adjacent to the sidewall 25 of the gate 26. The semiconductor layer 34 may be formed by an epitaxial growth process and may be comprised of single-crystal semiconductor material (e.g., single-crystal silicon). The epitaxial growth process may be selective in nature resulting in epitaxial growth from exposed semiconductor material (e.g., the device layer 12) and not from dielectric materials (e.g., the dielectric layers 24, 28). The crystal structure of the single-crystal semiconductor material of the device layer 12 serves as a crystalline template for the epitaxial growth of the semiconductor layer 34. The semiconductor layer 34 may be doped (e.g., heavily-doped) during epitaxial growth with a concentration of a dopant, such as an n-type dopant (e.g., arsenic or phosphorus) to provide n-type conductivity. In an embodiment, the dopant concentration may be greater than $1 \times 10^{19}$ cm$^{-3}$. The semiconductor layer 34 is raised relative to a top surface 10 of the device layer 12. In an embodiment, the semiconductor layer 34 may provide a raised cathode of a PIN diode.

Figure 6:
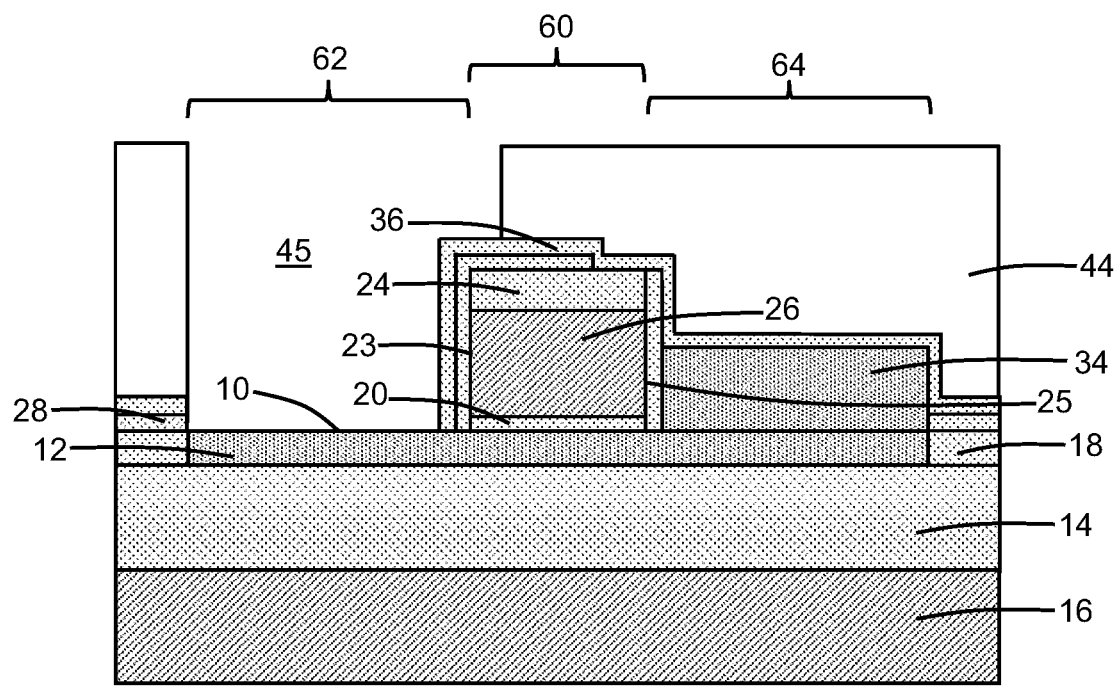

With reference to FIG. 6 in which like reference numerals refer to like features in FIG. 5 and at a subsequent fabrication stage, a dielectric layer 36 comprised of a dielectric material, such as silicon nitride, may be conformally deposited after the semiconductor layer 34 is formed. The dielectric layers 28, 36 may be patterned by lithography and etching processes to expose the section 62 of the device layer 12. To that end, an etch mask 44 is applied and an opening 45 is formed in the etch mask 44 that exposes the dielectric layer 36 over the section 62 of the device layer 12. The etch mask 44 may include a layer of a photoresist applied by a spin-coating process, pre-baked, exposed to light projected through a photomask, baked after exposure, and developed with a chemical developer to define the opening 45. Portions of the dielectric layers 28, 36 aligned with the opening 45 are removed by an etching process to open the section 62 of the device layer 12. The etch mask 30 may be stripped by, for example, ashing.

Figure 7:
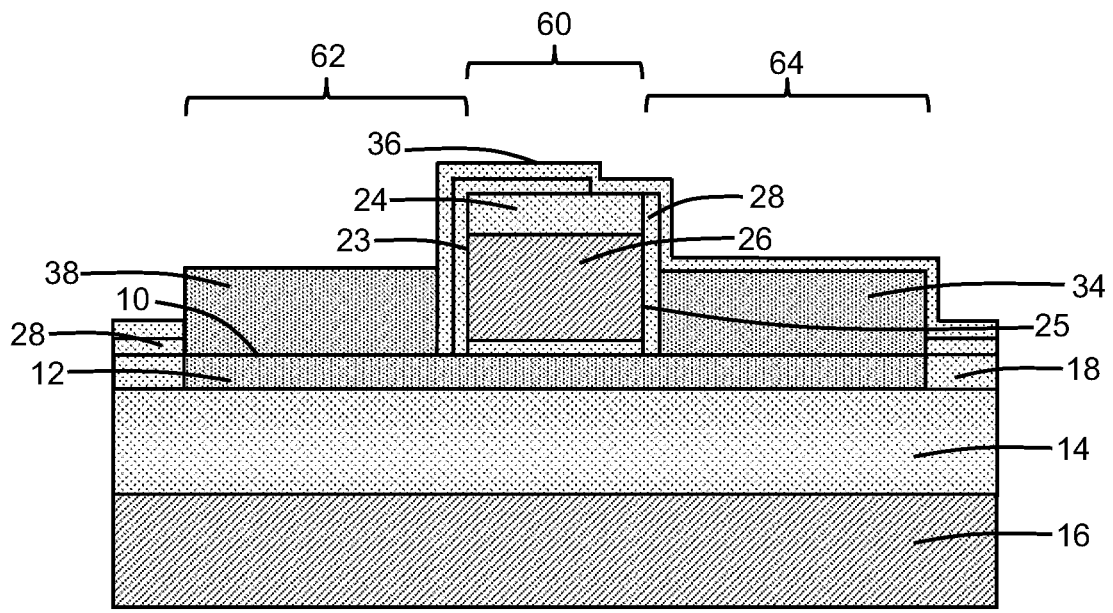

With reference to FIG. 7 in which like reference numerals refer to like features in FIG. 6 and at a subsequent fabrication stage, a semiconductor layer 38 is formed on the section 62 of the device layer 12 and adjacent to the sidewall 23 of the gate 26. The semiconductor layer 38 may be formed by an epitaxial growth process and may be comprised of single-crystal semiconductor material (e.g., single-crystal silicon). The epitaxial growth process may be selective in nature resulting in epitaxial growth from exposed semiconductor material (e.g., the device layer 12) and not from dielectric materials, such as the dielectric layer 36. The crystal structure of the single-crystal semiconductor material of the device layer 12 serves as a crystalline template for the epitaxial growth of the semiconductor layer 38. The semiconductor layer 38 may be doped (e.g., heavily-doped) during epitaxial growth with a concentration of a dopant, such as a p-type dopant (e.g., boron) to provide p-type conductivity. In an embodiment, the dopant concentration may be greater than $1 \times 10^{19}$ cm$^{-3}$. The semiconductor layer 38 is raised relative to the top surface 10 of the device layer 12. In an embodiment, the semiconductor layer 38 may provide a raised anode of the PIN diode.

The gate 26 is laterally positioned on the section 60 of the device layer 12 between the semiconductor layer 34 and the semiconductor layer 38, which may respectively provide the raised cathode and the raised anode of the PIN diode. The dielectric layers 28, 36 are laterally disposed between the semiconductor layer 38 and the sidewall 23 of the gate 26 as a sidewall spacer. In contrast, only the dielectric layer 28 is laterally disposed between the semiconductor layer 34 and the sidewall 25 of the gate 26 as a sidewall spacer. Consequently, the sidewall spacer between the gate 26 and the semiconductor layer 38 is thicker than the sidewall spacer between the gate 26 and the semiconductor layer 34.

Figure 8:
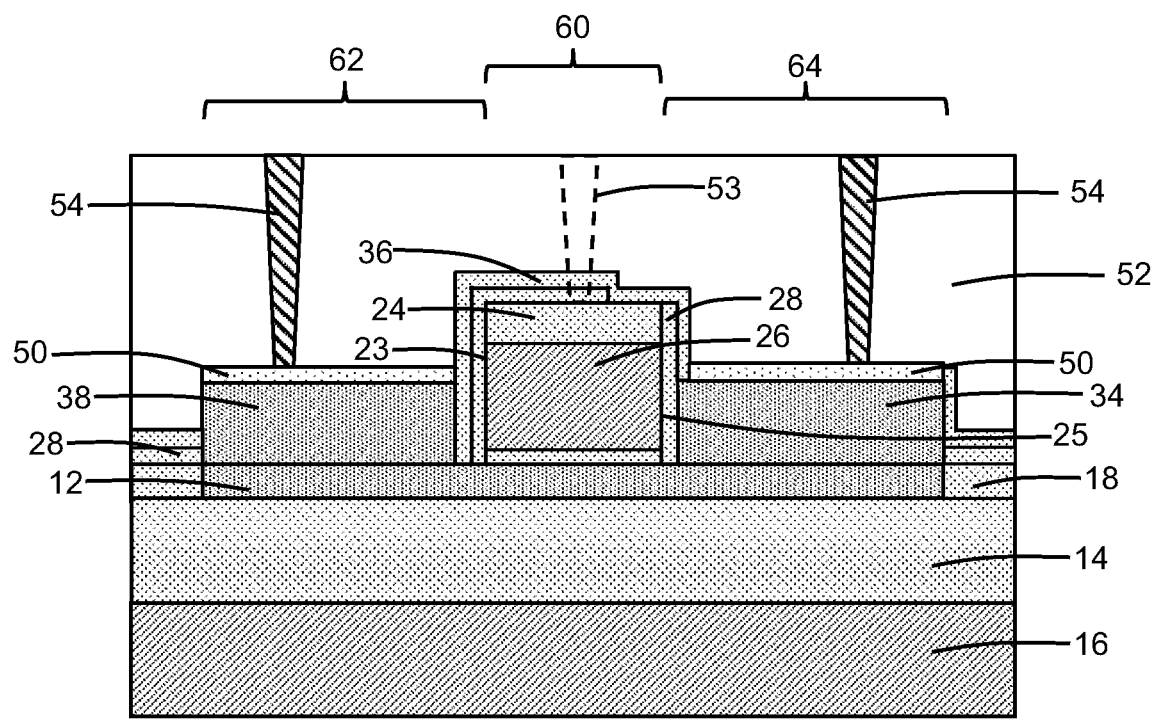
Figure 9:
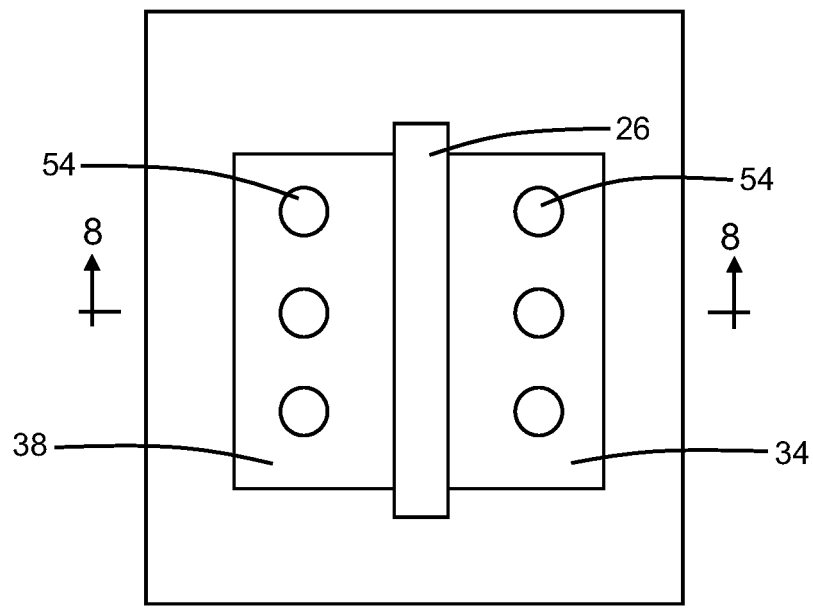

With reference to FIGS. 8, 9 in which like reference numerals refer to like features in FIG. 7 and at a subsequent fabrication stage, a silicide layer 50 is formed by a silicidation process on the semiconductor layer 34 and the semiconductor layer 38. Contacts 52, which are formed in a dielectric layer 54, may be coupled by the silicide layer 50 to the semiconductor layers 34, 38. In an embodiment, the gate 26 may be non-contacted. In an embodiment, the gate 26 may be contacted by a contact 53 that is also formed in the dielectric layer 40.

The device structure may be a PIN diode that includes a raised cathode (i.e., semiconductor layer 34) and a raised anode (i.e., semiconductor layer 38) as terminals, and in which the spacer-clad gate 26 is laterally positioned between the raised anode and raised cathode. Dopant may diffuse from the semiconductor layer 34 into the section 64 of the device layer 12 beneath the semiconductor layer 34 and contribute to the cathode. Dopant may diffuse from the semiconductor layer 38 into the section 62 of the device layer 12 beneath the semiconductor layer 38 and contribute to the anode. An intrinsic region is provided in the PIN diode by the section 60 of the device layer 12 arranged between the anode and the cathode and beneath the gate 26. The semiconductor layer 34 may be heavily-doped (e.g., n+) and the semiconductor layer 38 may also be heavily-doped (e.g., p+) with a dopant of an opposite conductivity type from the semiconductor layer 34. The semiconductor layers 34, 38 are typically heavily-doped because, for example, the semiconductor layers 34, 38 may provide ohmic contacts.

The semiconductor layer 34 and the semiconductor layer 38 are successively formed by different epitaxial growth processes. The device layer 12 in the sections 60, 62, 64 of the device layer 12 may contain silicon, silicon-germanium, or a combination of these semiconductor materials. The gate length (i.e., the length of the section 60 of the device layer 12 beneath the gate 26) can be readily adjusted for breakdown voltage tuning by adjusting the lateral dimension of the gate 26. The sidewall spacer between the gate 26 and the semiconductor layer 38 may be thicker than the sidewall spacer between the gate 26 and the semiconductor layer 34, which promoted by the different epitaxial growth processes used to form the semiconductor layers 34, 38. The doping in the section 60 of the device layer 12 can be adjusted (e.g., by an optional ion implantation) to tune (e.g., reduce) the breakdown voltage.

Forming the bipolar junction transistor using a silicon-on-insulator substrate operates to reduce the capacitance during operation in comparison with formation using a bulk substrate in which an additional well is required for device isolation. In an embodiment, the doped regions arranged in the sections 62, 64 of the device layer 12 beneath the semiconductor layers 34, 38 may extend over the full thickness of the device layer 12 to the buried insulator layer 14, which may be effective to reduce leakage during operation.

The diode device structure may be integrated with lateral bipolar junction transistors for radiofrequency applications. Extra masks may not be needed to form the diode device structure if diode fabrication stages are shared with fabrication stages forming the lateral bipolar junction transistors. In that regard, a single extra mask may be needed if the section 60 of the device layer 12 is implanted for breakdown voltage tuning.

Figure 10:
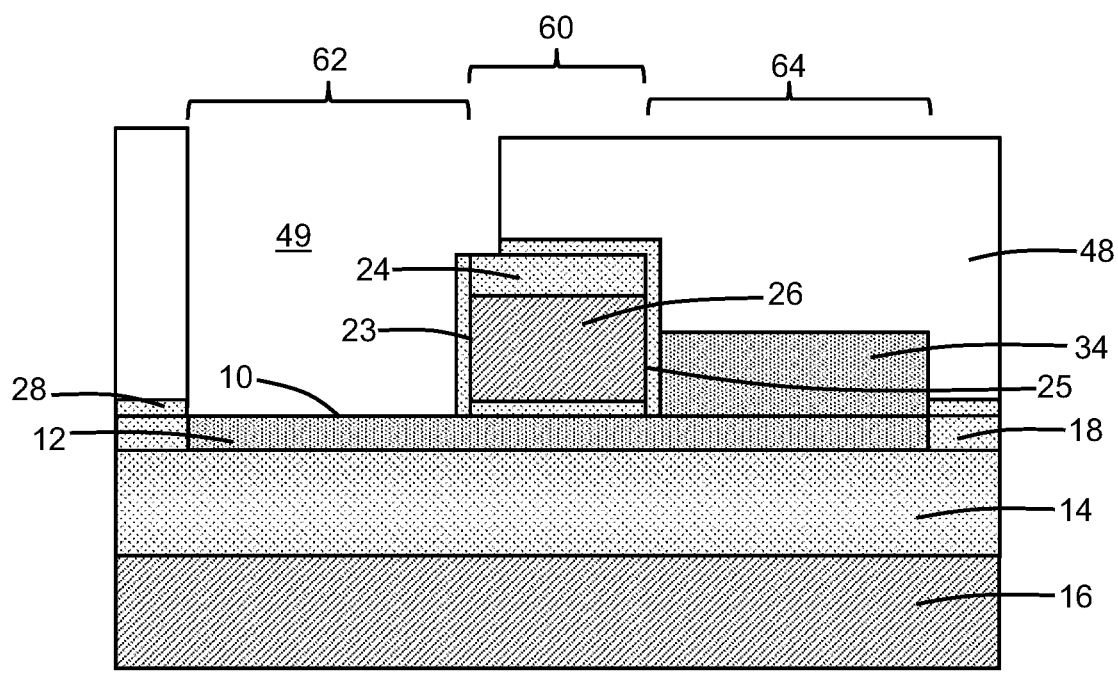
FIGS. 10-11 are cross-sectional views of a structure at successive fabrication stages of a processing method in accordance with alternative embodiments of the invention.

With reference to FIG. 10 in which like reference numerals refer to like features in FIG. 5 and at a subsequent fabrication stage in accordance with alternative embodiments, the dielectric layer 28 may be patterned and removed from the section 62 of the device layer 12 adjacent to the sidewall 23 of the gate 26 after the semiconductor layer 34 is formed. To that end, an etch mask 48 is applied and an opening 49 is formed in the etch mask 48 that exposes the dielectric layer 28 over the section 62 of the device layer 12. The exposed portion of the dielectric layer 28 may be etched and removed to expose the section 62 of the device layer 12. The etch mask 48 may include a layer of a photoresist applied by a spin-coating process, pre-baked, exposed to light projected through a photomask, baked after exposure, and developed with a chemical developer to define the opening 49. The exposed dielectric layer 28 is removed by an etching process. The etch mask 48 may be stripped by, for example, ashing.

Figure 11:
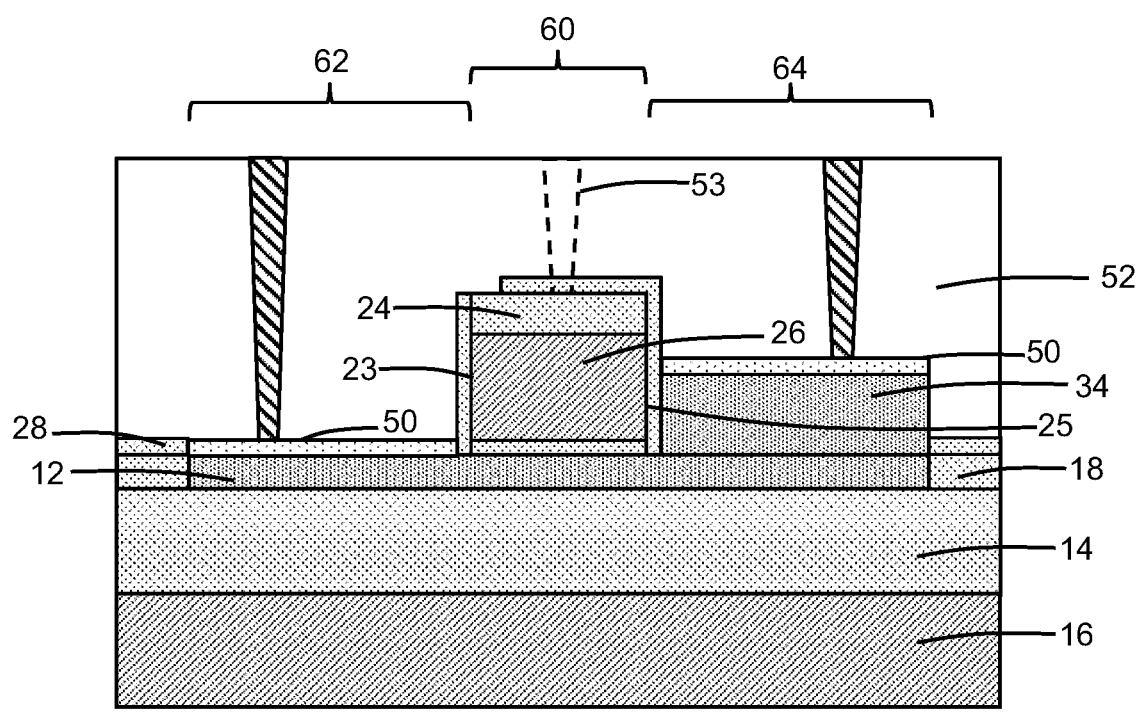

With reference to FIG. 11 in which like reference numerals refer to like features in FIG. 10 and at a subsequent fabrication stage, the silicide layer 50 is formed by a silicidation process on the semiconductor layer 34 providing the raised cathode of the Schottky barrier diode and is also formed on the opened section 62 of the device layer 12. The silicide layer 50 and the section 62 of the device layer 12 beneath the silicide layer 50 define an anode of a Schottky barrier diode. The section 62 of the device layer 12, which may be thinned by silicide formation, is physically and electrically contacted by the silicide layer 50, and is positioned in a vertical direction between the silicide layer 50 and the buried insulator layer 14.

In addition to the anode, the diode structure also includes the semiconductor layer 34 as a raised cathode of the Schottky barrier diode. The gate 26 is laterally positioned on the device layer 12 between the anode and the raised cathode of the Schottky barrier diode. The contacts 52 are coupled to the anode and the raised cathode. In an embodiment, the gate 26 may be non-contacted. In an embodiment, the gate 26 may be contacted by the contact 53 that is also formed in the dielectric layer 40.

The Schottky barrier diode may include a Schottky contact defining an anode at the interface between the silicide layer 50 and the device layer 12. The Schottky barrier diode includes a raised cathode (i.e., the semiconductor layer 34) as one of the terminals of Schottky barrier diode. In an embodiment, the raised cathode may be heavily-doped (e.g., n+). The gate length (i.e., the length of the section 60 of the device layer 12 beneath the gate 26) can be adjusted for breakdown voltage tuning. The sections 60, 62, 64 of the device layer 12 may comprise silicon, silicon-germanium, or a combination of these semiconductor materials.

Figure 12:
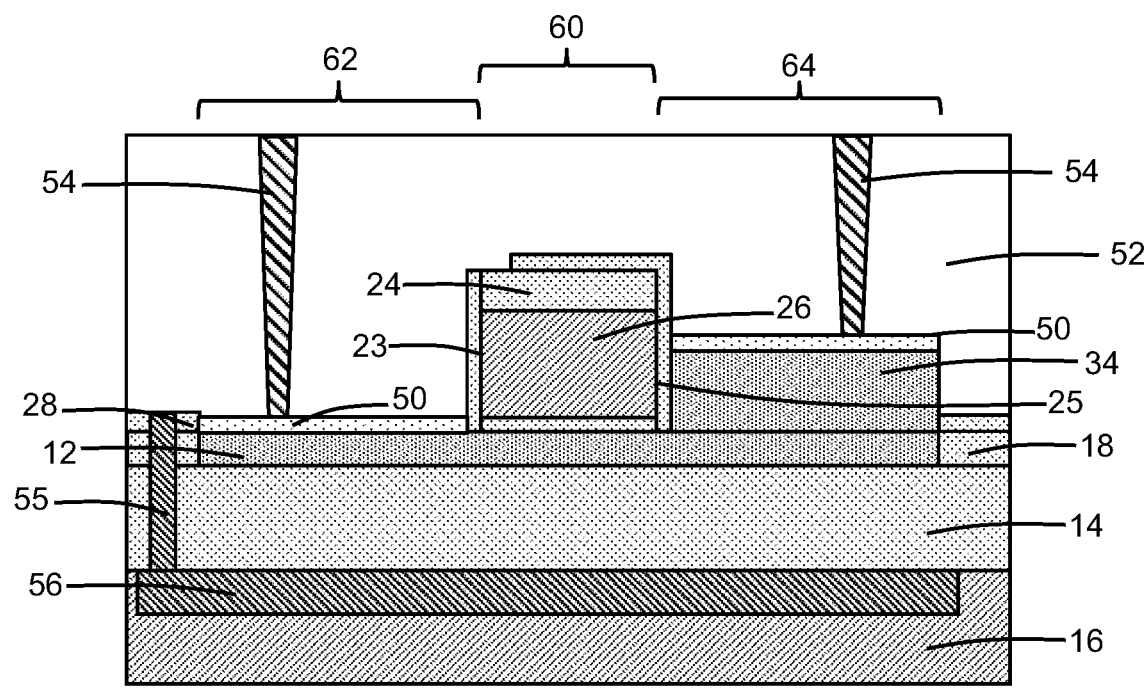
FIGS. 12-13 are cross-sectional views of structures in accordance with alternative embodiments of the invention.

With reference to FIG. 12 and in accordance with alternative embodiments, a back gate 56 may be formed in the handle substrate 16. In an embodiment, the back gate 56 may extend in a lateral direction beneath the anode, cathode, and gate of the Schottky barrier diode. The back gate 56 may be embodied in a doped region that is formed in the handle substrate 16 by a masked ion implantation process. A body contact 55 may be formed that extends through the buried insulator layer 14 to the back gate 56.

A bias voltage may be applied during operation 11 via the body contact 55 to the back gate 56. The bias voltage may be selected to tune performance parameters, such as on-resistance and/or breakdown voltage, of the Schottky barrier diode. In an alternative embodiment, the back gate 56 may be added to the device structure for the PIN diode.

Figure 13:
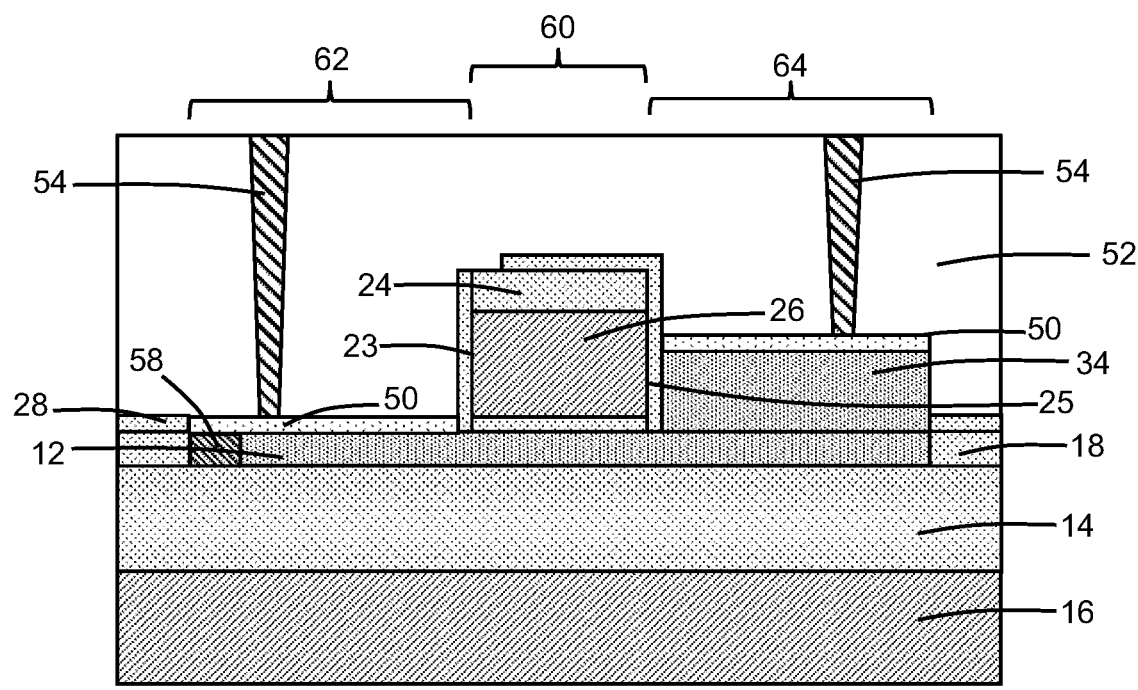

With reference to FIG. 13 in which like reference numerals refer to like features in FIG. 11 and in accordance with alternative embodiments, a guard ring 58 may be formed as a border region in the section 62 of the device layer 12 beneath the silicide layer 50. The guard ring 58 may be laterally positioned in the section 62 of the device layer 12 adjacent to the interface between the device layer 12 and the shallow trench isolation region 18. The guard ring 58 may be formed by introducing a dopant with a masked ion implantation process into a portion of the section 62 of the device layer 12 on which the silicide layer 50 is formed. In an embodiment, the guard ring 58 may be heavily doped with a p-type dopant, in contrast to the intrinsic or lightly-doped semiconductor material of the remainder of the section 62 of the device layer 12. The guard ring 58 may be effective to reduce device leakage during operation.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a diode, the structure comprising:
a silicon-on-insulator substrate including a handle substrate, a buried insulator layer, and a device layer, the buried insulator layer separating the device layer from the handle substrate, and the device layer including a first section, a second section, and a third section laterally positioned between the first section and the second section;
a first terminal including a first raised semiconductor layer on the first section of the device layer;
a second terminal on the second section of the device layer; and
a gate on the third section of the device layer,
wherein the third section of the device layer comprises an intrinsic semiconductor material.

2. The structure of claim 1 wherein the second terminal comprises a second raised semiconductor layer on the second section of the device layer.

3. The structure of claim 2 wherein the first raised semiconductor layer contains an n-type dopant, and the second raised semiconductor layer contains a p-type dopant.

4. The structure of claim 1 wherein the second terminal comprises a silicide layer on the second section of the device layer.

5. The structure of claim 4 further comprising:
a border region positioned in the second section of the device layer and beneath the silicide layer.

6. The structure of claim 5 further comprising:
a shallow trench isolation region penetrating through the device layer,
wherein the border region is positioned in the second section of the device layer adjacent to the shallow trench isolation region.

7. The structure of claim 5 wherein the device layer in the border region comprises heavily-doped semiconductor material.

8. The structure of claim 1 further comprising:
a back gate in the handle substrate beneath the first terminal, the second terminal, and the gate.

9. The structure of claim 1 wherein the device layer has a thickness in a range of about 4 nanometers to about 100 nanometers.

10. The structure of claim 1 wherein the second terminal comprises a silicide layer on the second section of the device layer, and the second section of the device layer is positioned between the silicide layer and the buried insulator layer.

11. The structure of claim 1 wherein the device layer comprises silicon, silicon-germanium, or a combination thereof.

12. The structure of claim 1 further comprising:
a first contact connected to the first terminal; and
a second contact connected to the second terminal,
wherein the gate is uncontacted.

13. The structure of claim 1 wherein the first terminal, the second terminal, and the gate are laterally positioned on the device layer.

14. The structure of claim 1 further comprising:
a shallow trench isolation region that penetrates fully through the device layer to the buried insulator layer.

15. The structure of claim 1 wherein the first section and the second section of the device layer comprise the intrinsic semiconductor material.

16. A method of fabricating a structure for a diode, the method comprising:
forming a first terminal including a first raised semiconductor layer on a first section of a device layer of a silicon-on-insulator substrate, wherein the silicon-on-insulator substrate includes a handle substrate and a buried insulator layer that separates the device layer from the handle substrate;
forming a second terminal on a second section of the device layer; and
forming a gate on a third section of the device layer,
wherein the third section of the device layer is laterally positioned between the first section of the device layer and the second section of the device layer, and the third section of the device layer comprises an intrinsic semiconductor material.

17. The method of claim 16 wherein forming the second terminal on the second section of the device layer comprises:
forming a second raised semiconductor layer on the second section of the device layer.

18. The method of claim 17 wherein the first raised semiconductor layer contains an n-type dopant, and the second raised semiconductor layer contains a p-type dopant.

19. The method of claim 16 wherein forming the second terminal on the second section of the device layer comprises:

forming a silicide layer on the second section of the device layer.

20. The method of claim 19 further comprising:

forming a guard ring positioned in the second section of the device layer beneath the silicide layer.

* * * * *